United States Patent
Hori et al.

(10) Patent No.: US 12,519,047 B2
(45) Date of Patent: Jan. 6, 2026

(54) SEMICONDUCTOR DEVICE

(71) Applicant: FUJI ELECTRIC CO., LTD., Kawasaki (JP)

(72) Inventors: Motohito Hori, Matsumoto (JP); Yoshinari Ikeda, Matsumoto (JP); Akira Hirao, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 456 days.

(21) Appl. No.: 18/138,948

(22) Filed: Apr. 25, 2023

(65) Prior Publication Data

US 2024/0006287 A1     Jan. 4, 2024

(30) Foreign Application Priority Data

Jun. 30, 2022  (JP) ................... 2022-106480

(51) Int. Cl.
| | |
|---|---|
| *H01L 23/48* | (2006.01) |
| *H01L 23/00* | (2006.01) |
| *H01L 23/492* | (2006.01) |
| *H01L 23/498* | (2006.01) |

(52) U.S. Cl.
CPC ...... *H01L 23/49822* (2013.01); *H01L 23/492* (2013.01); *H01L 23/49838* (2013.01); *H01L 24/16* (2013.01); *H01L 2224/16221* (2013.01); *H01L 2924/35121* (2013.01)

(58) Field of Classification Search
None
See application file for complete search history.

(56) References Cited

U.S. PATENT DOCUMENTS

| | | | |
|---|---|---|---|
| 10,396,023 B2 | 8/2019 | Inaba et al. | |
| 2006/0138647 A1* | 6/2006 | Crisp | H01L 24/73 257/723 |
| 2008/0185705 A1* | 8/2008 | Osborn | H01L 23/4985 257/E23.169 |
| 2012/0181898 A1* | 7/2012 | Hatakeyama | H03H 3/08 310/313 B |
| 2012/0252168 A1* | 10/2012 | Nah | H01L 21/4853 257/E21.502 |
| 2015/0179551 A1* | 6/2015 | Nakamura | H01L 23/481 257/773 |
| 2015/0223339 A1* | 8/2015 | Nakamura | H05K 7/2089 361/779 |
| 2017/0133308 A1 | 5/2017 | Inaba et al. | |

(Continued)

FOREIGN PATENT DOCUMENTS

| | | |
|---|---|---|
| JP | 11-220070 A | 8/1999 |
| JP | 2000-228476 A | 8/2000 |

(Continued)

*Primary Examiner* — Nicholas J Tobergte

(57) ABSTRACT

A semiconductor device includes an insulated circuit substrate, a semiconductor chip, a printed circuit board, an interposer, and a sealing member, the interposer including a plurality of post electrodes each having one end bonded to the semiconductor chip via a solder layer, an insulating layer provided to be separately opposed to the semiconductor chip and provided with a first penetration hole filled with part of the solder layer, and a conductor layer provided to be opposed to the printed circuit board and connected to another end of each of the post electrodes via the insulating layer.

12 Claims, 11 Drawing Sheets

(56) References Cited

U.S. PATENT DOCUMENTS

| | | | |
|---|---|---|---|
| 2017/0236782 A1* | 8/2017 | Nonaka | H01L 25/072 |
| | | | 257/667 |
| 2021/0020604 A1* | 1/2021 | Nakamura | H01L 21/565 |
| 2022/0406689 A1* | 12/2022 | Hori | H01L 23/49 |
| 2023/0411313 A1* | 12/2023 | Hirao | H01L 24/73 |

FOREIGN PATENT DOCUMENTS

| | | |
|---|---|---|
| JP | 2009-266986 A | 11/2009 |
| JP | 2017-92185 A | 5/2017 |
| JP | 2020-155512 A | 9/2020 |
| JP | 2021-82721 A | 5/2021 |
| JP | 2022-22521 A | 2/2022 |

\* cited by examiner

SEMICONDUCTOR DEVICE

CROSS-REFERENCE TO RELATED APPLICATION

This application claims benefit of priority under 35 USC 119 based on Japanese Patent Application No. 2022-106480 filed on Jun. 30, 2022, the entire contents of which are incorporated by reference herein.

BACKGROUND OF THE INVENTION

1. Field of the Invention

The present invention relates to a semiconductor device (a semiconductor module) equipped with power semiconductor chips.

2. Description of the Related Art

Power semiconductor chips (hereinafter, referred to simply as "semiconductor chips) are typically used as switching elements for power conversion.

JP 2022-22521 A discloses a semiconductor device including semiconductor chips provided on an insulated circuit substrate, a printed circuit board provided over the semiconductor chips, and interposers provided between the semiconductor chips and the printed circuit board, in which the respective interposers include an insulating layer, a conductor layer provided on the top surface of the insulating layer, and post electrodes connected to the bottom surface of the conductor layer.

JP 2021-82721 A discloses a semiconductor device including semiconductor chips provided on a stacked substrate, a printed circuit board provided over the semiconductor chips, and interposers provided between the semiconductor chips and the printed circuit board, in which the respective interposers include an insulating layer, post electrodes for emitter and for gate provided on one of the surfaces of the insulating layer opposed to the semiconductor chip, and a copper pattern for emitter serving as a main-electrode circuit layer and a copper pattern for gate serving as a control-electrode circuit layer each provided on the other surface of the insulating layer on the opposite side of the surface opposed to the semiconductor chip.

JP 2009-266986 A discloses a method of manufacturing a power conversion device including a step of executing solder bonding between signal terminals penetrating terminal penetration holes and connection terminals in a state in which a hole-provided insulating member is separated from a control circuit substrate. In the solder-bonding step, the solder when applied to opposite-side opening ends of the penetration holes passes through the through holes to reach main circuit-side opening ends due to a capillary phenomenon so as to rise and protrude.

JP 2000-228476 A discloses a semiconductor device with a configuration in which a solder-contact part of an outer lead can be provided with at least one slit or the solder-contact part of the outer lead can be provided with at least one penetration hole, and in particular, the penetration hole is used to serve as a surface-area increasing region, so as to allow a larger amount of solder to be supplied through the penetration hole further to the outer lead due to a capillary phenomenon, increasing the wettability of the solder accordingly.

JP H11-220070 A discloses a semiconductor device, in which cream-state solder melted by heat treatment is sucked into openings of small holes provided in an electrode terminal part bonded to an electrode pad due to a capillary phenomenon. While a copper-foil thickness of the electrode terminal part is about 35 micrometers, the small holes provided in the electrode terminal part can lead the solder to be sucked into the openings to further adhere to the top and bottom surfaces of the electrode terminal part, so as to ensure favorable and strong bonding conditions between the electrode terminal part and the electrode pad, as compared with a case of not being provided with any small holes in which the melted solder is led to adhere only to the bottom surface of the electrode terminal part.

JP 2020-155512 A discloses an interposer including an insulating plate-shaped member provided with an opening conforming to an outline of an electronic member, and a pair of electrodes interposing the opening and provided on one of the surfaces of the plate-shaped member.

JP2017-92185 A discloses a semiconductor device including a stacked substrate including an insulating plate and a circuit plate, a semiconductor chip with the front surface provided with a main electrode and a control electrode and with the rear surface fixed to the circuit plate, a first wired substrate including a first conductive member arranged to be opposed to and electrically connected to the first conductive member, a second wired substrate including a second conductive member arranged to be opposed to the control electrode and provided with an opening, and conductive posts having one ends electrically and mechanically connected to the control electrode and the other ends electrically and mechanically connected to the second conductive member, in which the first conductive member has a greater thickness than the second conductive member, and the first wired substrate is arranged inside the opening.

In the conventional semiconductor devices as disclosed in JP 2022-22521 A and JP 2021-82721 A, the solder creeps upward along the post electrodes of the interposers when the semiconductor chips and the interposers are bonded together via the solder, and the solder further spreads over the surfaces of the semiconductor chips. The creeping solder decreases gaps between the insulating layer of the respective interposers and the solder and thus prevents the sealing member from entering the gaps.

In addition, the spread of the solder increases the surface area of the solder to increase the contact area between the solder and the sealing member. Since the solder typically has bad adhesion to resin used for the sealing member, a binding force at the interface between the sealing member and the solder is decreased when a change in temperature is caused in the semiconductor device, which tends to apply a stress directly on the respective bonded parts and thus easily leads to separation or causes cracks. Further, the spreading solder could cause insulation failure if reaching the ends of the semiconductor chips.

SUMMARY OF THE INVENTION

In view of the foregoing problems, the present invention provides a semiconductor device having a configuration that can improve reliability and decrease insulation failure if a change in temperature is caused.

An aspect of the present invention inheres in a semiconductor device including: an insulated circuit substrate; a semiconductor chip deposited on one of main surfaces of the insulated circuit substrate; a printed circuit board provided to be opposed to the one of the main surfaces of the insulated circuit substrate; an interposer provided between the semiconductor chip and the printed circuit board; and a sealing member provided to seal the semiconductor chip, the interposer, and the printed circuit board, the interposer including a plurality of post electrodes each having one end bonded to the semiconductor chip via a solder layer, an insulating layer provided to be separately opposed to the semiconductor chip and provided with a first penetration hole filled with part of the solder layer, and a conductor layer provided to be opposed to the printed circuit board and connected to another end of each of the post electrodes via the insulating layer.

Another aspect of the present invention inheres in a semiconductor device including: an insulated circuit substrate; a semiconductor chip deposited on one of main surfaces of the insulated circuit substrate; a plurality of post electrodes each having one end bonded to the semiconductor chip via a solder layer; a printed circuit board provided to be opposed to the one of the main surfaces of the insulated circuit substrate; and a sealing member provided to seal the semiconductor chip and the printed circuit board, the printed circuit board including an insulating layer provided to be separately opposed to the semiconductor chip and provided with a first penetration hole filled with part of the solder layer, and a conductor layer connected to another end of each of the post electrodes via the insulating layer.

DETAILED DESCRIPTION

Figure 1:
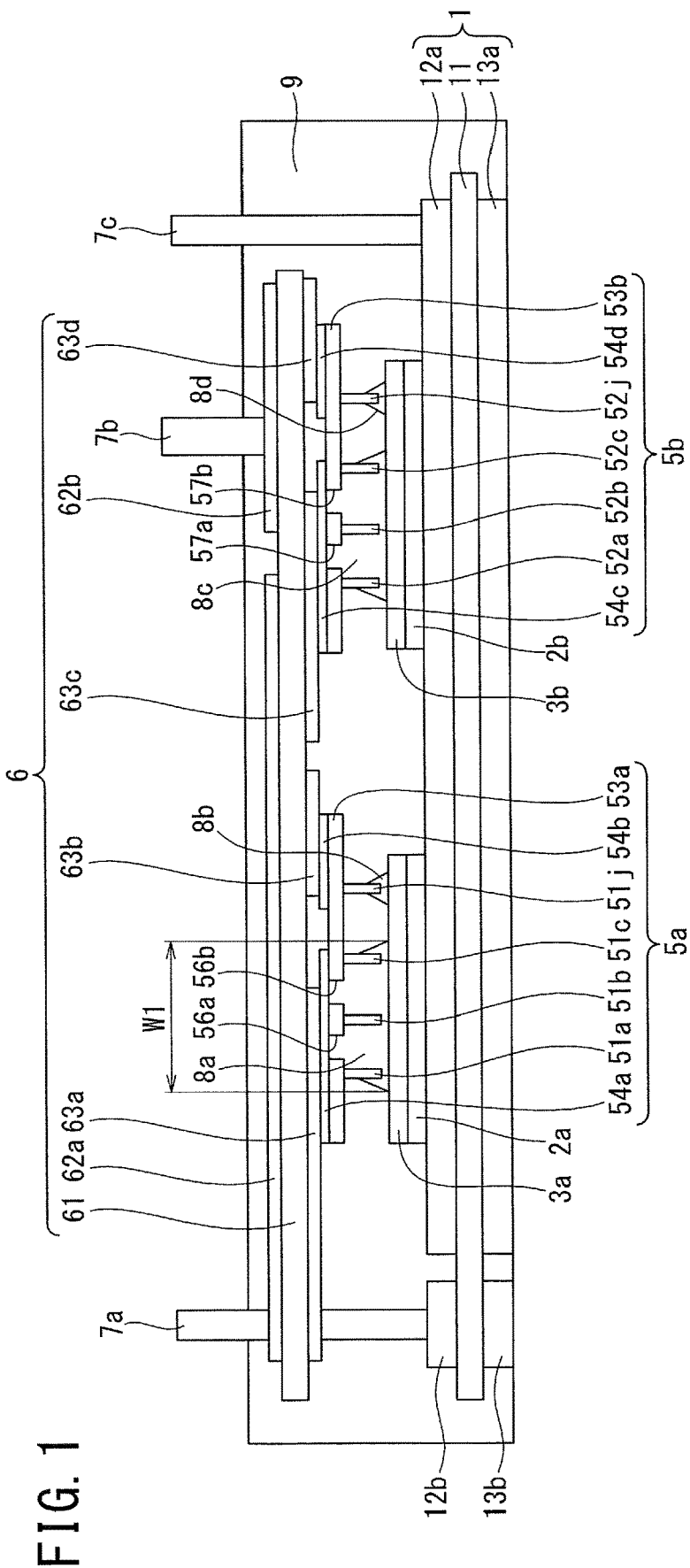
FIG. 1 is a side view illustrating a semiconductor device according to a first embodiment.

With reference to the drawings, first to fifth embodiments of the present invention will be described below.

In the drawings, the same or similar elements are indicated by the same or similar reference numerals. The drawings are schematic, and it should be noted that the relationship between thickness and planer dimensions, the thickness proportion of each layer, and the like are different from real ones. Moreover, in some drawings, portions are illustrated with different dimensional relationships and proportions. The first to fifth embodiments described below merely illustrate schematically devices and methods for specifying and giving shapes to the technical idea of the present invention, and the span of the technical idea is not limited to materials, shapes, structures, and relative positions of elements described herein.

Additionally, definitions of directions such as upper and lower in the following description are simply definitions for convenience of description, and do not limit the technological concept of the present invention. For example, when observing an object rotated by 90 degrees, the upper and lower are converted to left and right to be read, and when observing an object rotated by 180 degrees, the upper and lower are read reversed, which should go without saying.

First Embodiment

A first embodiment is illustrated as a semiconductor device with a "1-in-1" power semiconductor module having functions for a single semiconductor element, as illustrated in FIG. 1. The semiconductor device according to the first embodiment includes an insulated circuit substrate 1, semiconductor chips 3a and 3b deposited on one main surface (the top surface) of the insulated circuit substrate 1, a printed circuit board 6 opposed to the top surface of the insulated circuit substrate 1 and arranged over the respective semiconductor chips 3a and 3b, and interposers 5a and 5b provided to ensure a conductive connection between the respective semiconductor chips 3a and 3b and the printed circuit board 6. The top and side surfaces of the insulated circuit substrate 1, the semiconductor chips 3a and 3b, the interposers 5a and 5b, and the printed circuit board 6 are sealed with a sealing member 9.

The insulated circuit substrate 1 includes an insulating substrate 11, conductor layers (upper conductor layers) 12a and 12b deposited on the top surface side of the insulating substrate 11, and conductor layers (lower conductor layers) 13a and 13b deposited on the bottom surface side of the insulating substrate 11. The insulated circuit substrate 1 may be a direct copper bonded (DCB) substrate or an active metal brazed (AMB) substrate, for example. The insulating substrate 11 is a ceramic substrate made from alumina ($Al_2O_3$), aluminum nitride (AlN), or silicon nitride ($Si_3N_4$), or a resin insulating substrate including polymer material, for example. The upper conductor layers 12a and 12b and the lower conductor layers 13a and 13b are each conductor foil of metal such as copper (Cu) and aluminum (Al), for example.

The respective semiconductor chips 3a and 3b are deposited on the top surface of the upper conductor layer 12a of the insulated circuit substrate 1 via bonding layers 2a and 2b made from solder or sintered material, for example. The semiconductor chips 3a and 3b as used herein can each be a metal-oxide-semiconductor field effect transistor including silicon (Si) (a Si-MOSFET) or a MOSFET using silicon carbide (SiC) (a SiC-MOSFET), for example, and the present embodiment is illustrated below with the case in which the semiconductor chips 3a and 3b are each a Si-MOSFET.

The semiconductor chips 3a and 3b each have a rectangular planar pattern, for example. The respective semiconductor chips 3a and 3b have a size of about 10 millimeters× 10 millimeters, for example, but the size may be determined as appropriate. The respective semiconductor chips 3a and 3b have a thickness of about 100 micrometers, for example, but the thickness may be determined as appropriate. Although not illustrated in FIG. 1, the semiconductor chips 3a and 3b each include a control electrode (a gate electrode) and a first main electrode (a source electrode) on the top surface side, and a second main electrode (a drain electrode) on the bottom surface side.

While the present embodiment is illustrated in FIG. 1 with the case in which the two semiconductor chips 3a and 3b are provided, the number of the semiconductor chips to be provided may be changed as appropriate depending on a current capacity of the semiconductor module, for example, and the semiconductor device according to the present embodiment may include a single semiconductor chip or may include three or more semiconductor chips.

The interposers 5a and 5b are arranged on the top surfaces of the corresponding semiconductor chips 3a and 3b via solder layers 8a to 8d. The solder layers 8a to 8d are each made from lead-free solder such as tin-antimony-based (Sn—Sb), tin-copper-based (Sn—Cu), tin-copper-silver-based (Sn—Cu—Ag), tin-silver-based (Sn—Ag), tin-silver-copper-based (Sn—Ag—Cu), tin-silver-bismuth-copper-based (Sn—Ag—Bi—Cu), tin-indium-silver-bismuth-based (Sn—In—Ag—Bi), tin-zinc-based (Sn—Zn), tin-zinc-bismuth-based (Sn—Zn—Bi), tin-bismuth-based (Sn—Bi), or tin-indium-based (Sn—In) solder, or leaded solder such as tin-lead-based (Sn—Pb) solder, for example.

The respective interposers 5a and 5b are provided to correspond to the respective semiconductor chips 3a and 3b. The use of the interposers 5a and 5b for the conductive connection between the respective semiconductor chips 3a and 3b and the printed circuit board 6 can reliably ensure the bonding between the respective semiconductor chips 3a and 3b and the printed circuit board 6 if the deposited positions of the semiconductor chips 3a and 3b are displaced, as compared with a case of not using any interposers but using post electrodes for ensuring the conductive connection between the respective semiconductor chips 3a and 3b and the printed circuit board 6.

Figure 2:
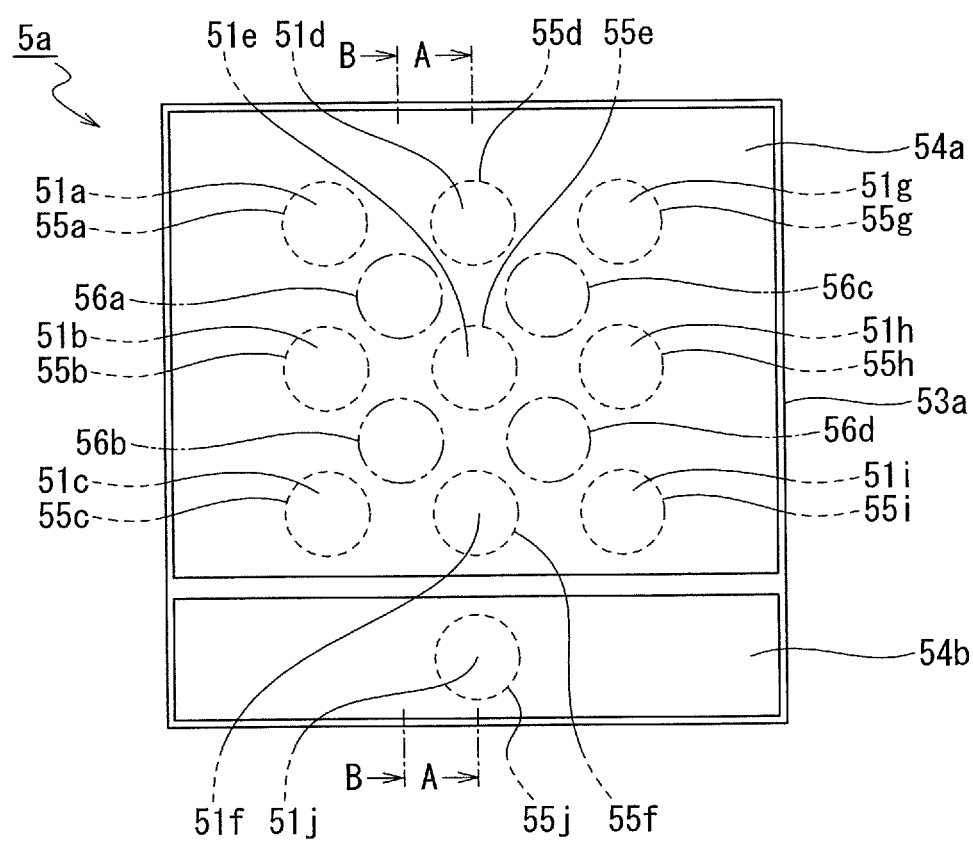
FIG. 2 is a plan view illustrating an interposer in the semiconductor device according to the first embodiment.
Figure 3:
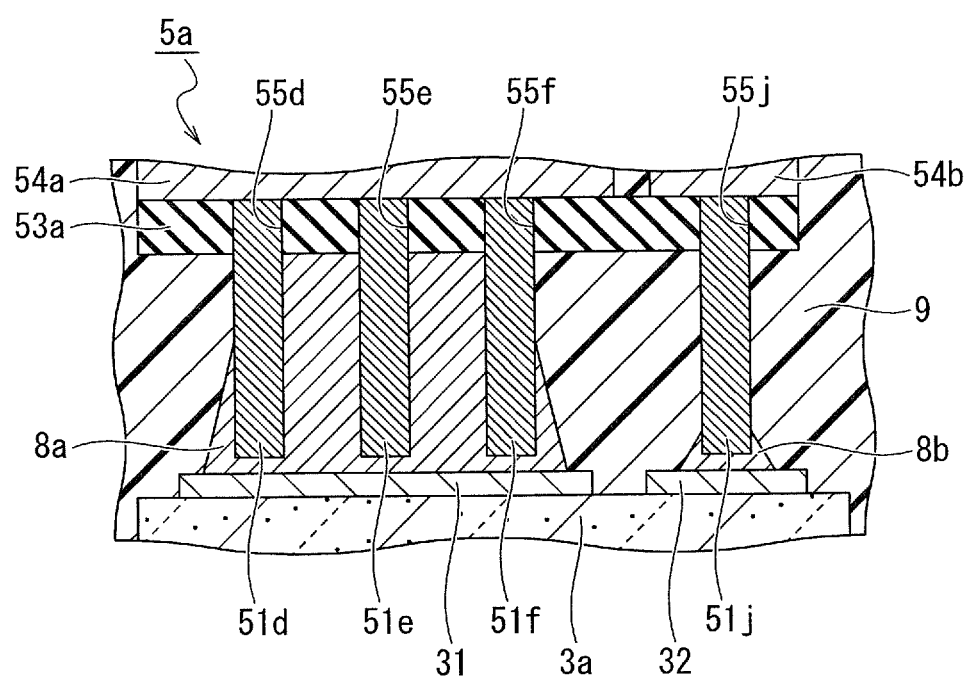
FIG. 3 is a cross-sectional view as viewed from direction A-A in FIG. 2.

FIG. 2 is a plan view of the interposer 5a illustrated in FIG. 1. FIG. 2 schematically indicates, by the broken lines, penetration holes 55a to 55j provided in an insulating layer 53a hidden below conductor layers 54a and 54b, and post electrodes 51a to 51j serving as conductor members penetrating the penetration holes 55a to 55j. FIG. 3 is a cross-sectional view illustrating the circumferential elements of the interposer 5a taken along line A-A in FIG. 2, and FIG. 4 is a cross-sectional view illustrating the circumferential elements of the interposer 5a taken along line B-B in FIG. 2.

Figure 4:
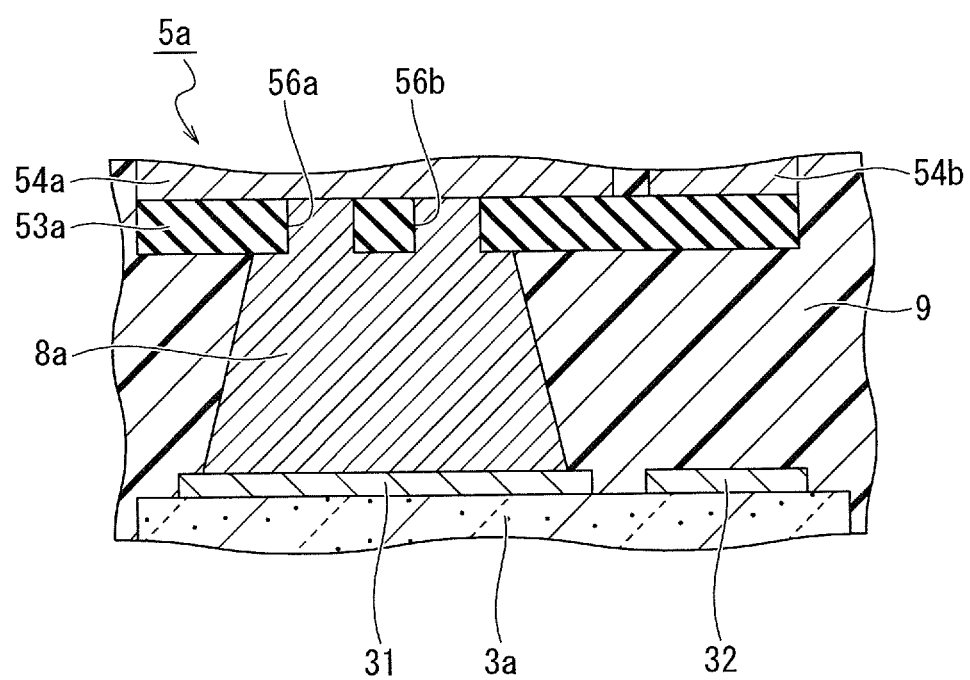
FIG. 4 is a cross-sectional view as viewed from direction B-B in FIG. 2.
Figure 5:
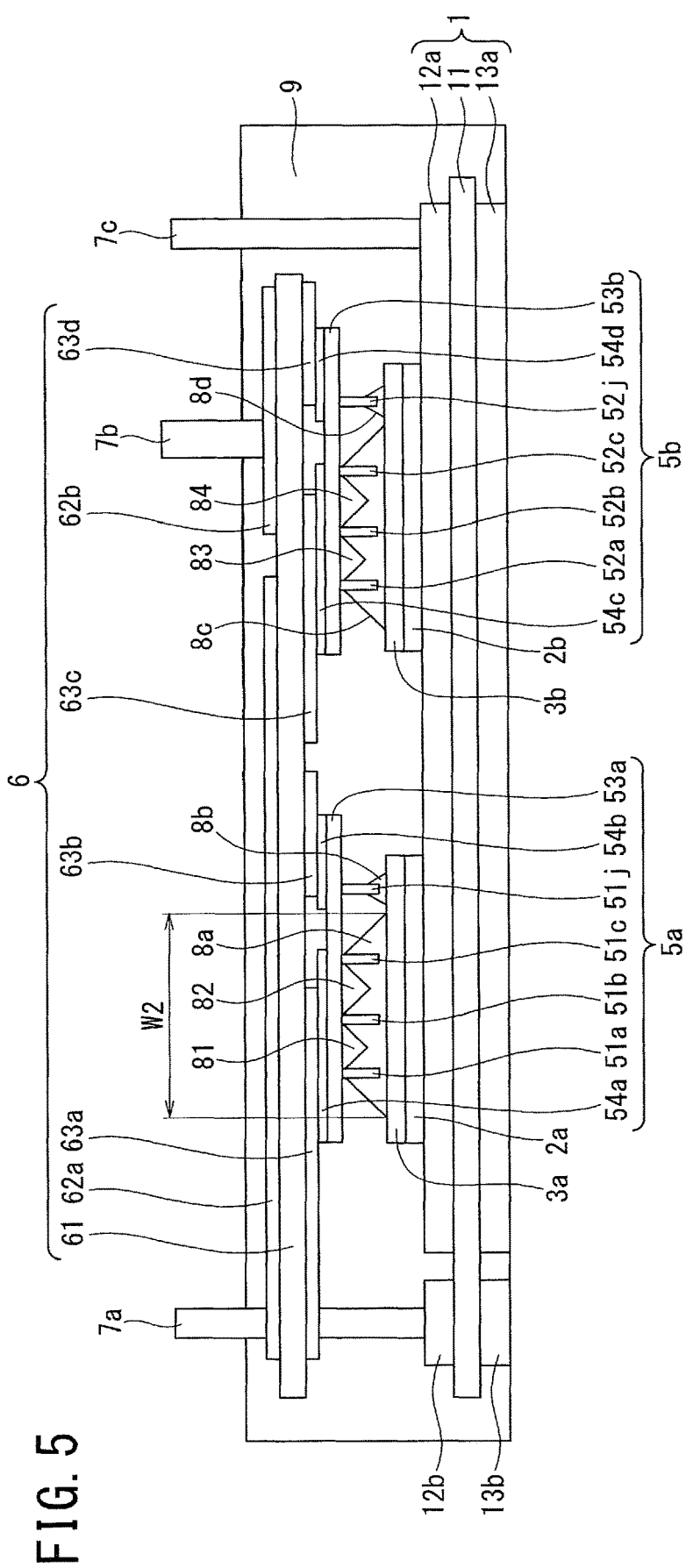
FIG. 5 is a side view illustrating a semiconductor device of a comparative example.

As illustrated in FIGS. 3 and 4, the semiconductor chip 3a includes a source electrode 31 and a gate electrode 32 on the top surface side. As illustrated in FIG. 1 to FIG. 4, the interposer 5a includes the insulating layer 53a separately opposed to the top surface of the semiconductor chip 3a, the conductor layers 54a and 54b deposited on the top surface of the insulating layer 53a, and the post electrodes 51a to 51j connected to the respective bottom surfaces of the conductor layers 54a and 54b through the penetration holes 55a to 55j provided in the insulating layer 53a.

The material to be used for the insulating layer 53a can be resin such as polyimide, for example. The material to be used for the respective conductor layers 54a and 54b can be metal material such as copper (Cu), for example. The respective post electrodes 51a to 51j have a stick-like (a pin-like) or columnar shape, and in particular, may be a round column, a cylindroid, or a polygonal column such as a triangular column or a quadrangular column, for example. The respective post electrodes 51a to 51j may be projection electrodes (bumps). The material to be used for the respective post electrodes 51a to 51j can be metal material such as copper (Cu) or gold (Au), for example.

A length of the respective post electrodes 51a to 51j is in a range of about 0.5 millimeters or greater and 1.5 millimeters or shorter, for example, but may be determined as appropriate. A diameter of the respective post electrodes 51a to 51j is in a range of about 0.3 millimeters or greater and 1 millimeter or shorter, for example, but may be determined as appropriate.

As illustrated in FIG. 1 to FIG. 3, the respective lower ends of the post electrodes for source 51a to 51i, among the post electrodes 51a to 51j, are bonded to the source electrode 31 of the semiconductor chip 3a via the solder layer 8a. The respective upper ends of the post electrodes 51a to 51i are connected to the conductor layer 54a. The post electrodes 51a to 51i are arranged into a 3×3 matrix. A pitch of the matrix of the post electrodes 51a to 51i is set in a range of about 1 millimeter or greater and 2 millimeters or smaller, for example, but may be determined as appropriate. The number and the arranged positions of the post electrodes 51a to 51i are not limited to those as illustrated. The lower end of the post electrode for gate 51j is bonded to the gate electrode 32 of the semiconductor chip 3a via the solder layer 8b. The upper end of the post electrode 51j is connected to the conductor layer 54b.

As illustrated in FIG. 1 to FIG. 4, the insulating layer 53a is further provided with penetration holes 56a to 56d, in addition to the penetration holes 55a to 55i through which the post electrodes 51a to 51i penetrate, between the respective post electrodes 51a to 51i and the respective penetration holes 55a to 55j. FIG. 1 schematically indicates the penetration holes 56a and 56b hidden by the side surface of the insulating layer 53a. FIG. 2 schematically indicates, by the dashed and dotted lines, the penetration holes 56a to 56d hidden under the conductor layer 54a. The penetration holes 56a to 56d penetrate the insulating layer 53a so as to lead the bottom surface of the conductor layer 54a to be exposed.

As illustrated in FIG. 2, the penetration hole 56a is provided separately from the respective post electrodes 51a, 51b, 51d, and 51e at the equal distances. The penetration hole 56b is provided separately from the respective post electrodes 51b, 51c, 51e, and 51f at the equal distances. The penetration hole 56c is provided separately from the respective post electrodes 51d, 51e, 51g, and 51h at the equal distances. The penetration hole 56d is provided separately from the respective post electrodes 51e, 51f, 51h, and 51i at the equal distances. The respective arranged positions of the penetration holes 56a to 56d are not limited to those as illustrated, and are only required to be located between the respective post electrodes 51a to 51i.

While FIG. 2 illustrates the case in which the penetration holes 56a to 56d each have a circular planar pattern that is the same as the respective penetration holes 55a to 55j. the shape of the penetration holes 56a to 56d may be determined as appropriate and may be different from the shape of the penetration holes 55a to 55j. The respective penetration holes 56a to 56f may have a triangular, rectangular, or oval planar pattern, for example. While FIG. 2 illustrates the case in which the respective penetration holes 56a to 56d have the same size as the respective penetration holes 55a to 55j, the respective penetration holes 56a to 56d may have a size different from that of the penetration holes 55a to 55j, and may have either a greater size or a smaller size than the penetration holes 55a to 55j. While FIG. 2 illustrates the case of including the four penetration holes 56a to 56d, the number of the penetration holes to be provided is not limited to that as illustrated, and may be changed as appropriate depending on the number or the density of the post electrodes 51a to 51i.

The respective penetration holes 56a to 56d are filled with part of the solder layer 8a for bonding the source electrode 31 of the semiconductor chip 3a to the respective post electrodes 51a to 51i. The solder of the solder layer 8a during the heat treatment for bonding the source electrode 31 of the semiconductor chip 3a to the respective post electrodes 51a to 51i creeps upward along the post electrodes 51a to 51i and enters the penetration holes 56a to 56d due to a capillary phenomenon to further reach the conductor layer 54a. The solder layer 8a is also provided between the respective post electrodes 51a to 51i.

The interposer 5b illustrated in FIG. 1 has a configuration similar to that of the interposer 5a. As illustrated in FIG. 1, the interposer 5b includes the insulating layer 53b separately opposed to the semiconductor chip 3b, the conductor layers 54c and 54d deposited on the top surface of the insulating layer 53b, and the post electrodes 52a to 52c and 52j penetrating the insulating layer 53b and connected to the respective bottom surfaces of the conductor layers 54c and 54d.

The respective lower ends of the post electrodes 52a to 52c for source, among the post electrodes 52a to 52c and 52j, are bonded to a source electrode (not illustrated) of the semiconductor chip 3b via the solder layer 8c. The respective upper ends of the post electrodes 52a to 52c are connected to the conductor layer 54c. The lower end of the post electrode 52j for gate is bonded to a gate electrode (not illustrated) of the semiconductor chip 3b via the solder layer 8d. The upper end of the post electrode 52j is connected to the conductor layer 54d.

The insulating layer 53b is further provided with penetration holes 57a and 57b, in addition to penetration holes (not illustrated) through which the post electrodes 52a to 52c penetrate, between the post electrodes 52a to 52c. FIG. 1 schematically indicates the penetration holes 57a and 57b hidden by the side surface of the insulating layer 53b. The respective penetration holes 57a and 57b are filled with part of the solder layer 8c for bonding the source electrode (not illustrated) of the semiconductor chip 3b to the respective post electrodes 52a to 52c.

The printed circuit board 6 is arranged over the semiconductor chips 3a and 3b via the interposers 5a and 5b, as illustrated in FIG. 1. The printed circuit board 6 includes an insulating layer 61, conductor layers (upper conductor layers) 62a and 62b deposited on the top surface side of the insulating layer 61, and conductor layers (lower conductor layers) 63a to 63d deposited on the bottom surface side of the insulating layer 61.

The insulating layer 61 is made from insulating material such as ceramic or resin mainly including alumina ($Al_2O_3$), aluminum nitride (AlN), or silicon nitride ($Si_3N_4$), for example. The insulating layer 61 may be a resin substrate made from polyimide resin or a combination of glass fiber and epoxy resin, for example.

The upper conductor layers 62a and 62b and the lower conductor layers 63a to 63d are each conductor foil of metal such as copper (Cu) and aluminum (Al), for example. The upper conductor layers 62a and 62b and the lower conductor layers 63a to 63d may be plated with copper (Cu), nickel (Ni), or tin (Sn), for example.

The lower conductor layer 63a is bonded to the conductor layer 54a of the interposer 5a via a bonding layer (not illustrated) made from solder or sintered material, for example. The lower conductor layer 63b is bonded to the conductor layer 54b of the interposer 5a via a bonding layer (not illustrated) made from solder or sintered material, for example. The lower conductor layer 63c is bonded to the conductor layer 54c of the interposer 5b via a bonding layer (not illustrated) made from solder or sintered material, for example. The lower conductor layer 63d is bonded to the conductor layer 54d of the interposer 5b via a bonding layer (not illustrated) made from solder or sintered material, for example.

The upper conductor layer 62a is electrically connected to the respective lower conductor layers 63a and 63c via conductor members (not illustrated) provided in penetration holes penetrating the insulating layer 61. The upper conductor layer 62b is electrically connected to the respective lower conductor layers 63b and 63d via conductor members (not illustrated) provided in penetration holes penetrating the insulating layer 61.

A source-side connection terminal 7a is inserted to the printed circuit board 6 to penetrate through the upper conductor layer 62a, the insulating layer 61, and the lower conductor layer 63a of the printed circuit board 6. The source-side connection terminal 7a is made from metal material such as copper (Cu), for example. The lower end of the source-side connection terminal 7a is bonded to the upper conductor layer 12b of the insulated circuit substrate 1 via a bonding layer (not illustrated) made from solder or sintered material, for example. The upper end of the source-side connection terminal 7a projects from the top surface of the sealing member 9 so as to be connected to an external circuit. The source-side connection terminal 7a leads current from the source electrode 31 of the semiconductor chip 3a and the source electrode (not illustrated) of the semiconductor chip 3b to be supplied to the external circuit through the respective interposers 5a and 5b and the printed circuit board 6.

The lower end of a gate connection terminal 7b is bonded to the upper conductor layer 62b of the printed circuit board 6 via a bonding layer (not illustrated) made from solder or sintered material, for example. The gate connection terminal 7b is made from metal material such as copper (Cu), for example. The upper end of the gate connection terminal 7b projects from the top surface of the sealing member 9 so as to be connected to the external circuit. The gate connection terminal 7b supplies control signals for controlling ON-OFF operations of the respective semiconductor chips 3a and 3b to the gate electrode 32 of the semiconductor chip 3a and the gate electrode (not illustrated) of the semiconductor chip 3b through the printed circuit board 6 and the respective interposers 5a and 5b.

The lower end of the drain-side connection terminal 7c is connected to the upper conductor layer 12a of the insulated circuit substrate 1 via a bonding layer (not illustrated) made from solder or sintered material, for example. The drain-side connection terminal 7c is made from metal material such as copper (Cu), for example. The upper end of the drain-side connection terminal 7c projects from the top surface of the sealing member 9 so as to be connected to the external circuit. The drain-side connection terminal 7c leads current to be supplied to the respective drain electrodes (not illustrated) of the semiconductor chips 3a and 3b via the upper conductor layer 12a.

The circumferences of the semiconductor chips 3a and 3b, the interposers 5a and 5b, and the printed circuit board 6 are sealed with the sealing member 9 so as to be electrically insulated from the other peripheral elements. The insulated circuit substrate 1 is exposed on the bottom surface of the sealing member 9. The sealing member 9 may be made from resin material such as thermosetting resin, and specific examples include epoxy resin, maleimide resin, and cyanate resin.

Comparative Example

A semiconductor device of a comparative example is described below. The semiconductor device of the comparative example differs from the semiconductor device according to the first embodiment illustrated in FIG. 1 in that the insulating layers 53a and 53b of the interposers 5a and 5b are provided only with the penetration holes (not illustrated) through which the post electrodes 51a to 51c and 52a to 52c penetrate, but are not provided with the through holes to be filled with part of the respective solder layers 8a and 8c included in the semiconductor device according to the first embodiment as illustrated in FIG. 1.

In the semiconductor device of the comparative example, the solder of the solder layers 8a and 8b creeps upward along the post electrodes 51a to 51c and 52a to 52c of the interposers 5a and 5b when the semiconductor chips 3a and 3b are bonded to the interposers 5a and 5b via the solder layers 8a to 8d, and gaps 81 to 84 thus may be caused between the insulating layers 53a and 53b of the interposers 5a and 5b and the solder layers 8a and 8c, which prevents the entrance of the sealing member 9 if the gaps 81 to 84 are narrow. In addition, since the comparative example tends to increase the width W2 of the range in which the respective solder layers 8a and 8c spread over the respective surfaces of the semiconductor chips 3a and 3b, the surface areas of the solder layers 8a and 8c are also increased, and the contact surfaces between the solder layers 8a and 8c and the sealing member 9 are inevitably increased.

During the operation of the semiconductor device of the comparative example, a binding force at the interface between the sealing member 9 and the respective solder layers 8a and 8c is decreased if a change in temperature such as a heat cycle or a power cycle is caused in the semiconductor device, which tends to apply a stress directly on the respective bonded parts and thus easily leads to separation or causes cracks. Further, the solder layers 8a and 8c spreading over the surfaces of the semiconductor chips 3a and 3b could also cause insulation failure if reaching the ends of the semiconductor chips 3a and 3b.

The semiconductor device according to the first embodiment has the configuration as described above that differs from the semiconductor device of the comparative example in that the insulating layers 53a and 53b of the interposers 5a and 5b are provided with the penetration holes 56a to 56d, 57a, and 57d penetrating the insulating layers 53a and 53b to lead the conductor layers 54a and 54c to be exposed between the respective post electrodes 51a to 51i and 52a to 52c, as illustrated in FIG. 1 to FIG. 4. Since the penetration holes 56a to 56d, 57a, and 57d lead the solder of the solder layers 8a and 8c to be drawn upward due to a capillary phenomenon when the semiconductor chips 3a and 3b are bonded to the interposers 5a and 5b via the solder layers 8a to 8d, an extra part of the solder layers 8a and 8c creeps upward along the post electrodes 51a to 51i and 52a to 52c and further enters the respective penetration holes 56a to 56d, 57a, and 57b. This can avoid a cause of gaps between the solder layers 8a and 8c and the insulating layers 53a and 53b. Further, since the extra part of the solder layers 8a and 8c tends to be concentrated in the center of the post electrodes 51a to 51i and 52a to 52c, the width W1 (refer to FIG. 1) of the range in which the solder layers 8a and 8c spread over the respective surfaces of the semiconductor chips 3a and 3b can be decreased, avoiding the expansion of the spreading area of the solder layers 8a and 8b. This configuration can improve the reliability and avoid or decrease the insulation failure of the semiconductor device according to the first embodiment if a change in temperature is caused.

<Method of Manufacturing Semiconductor Device>

Figure 6:
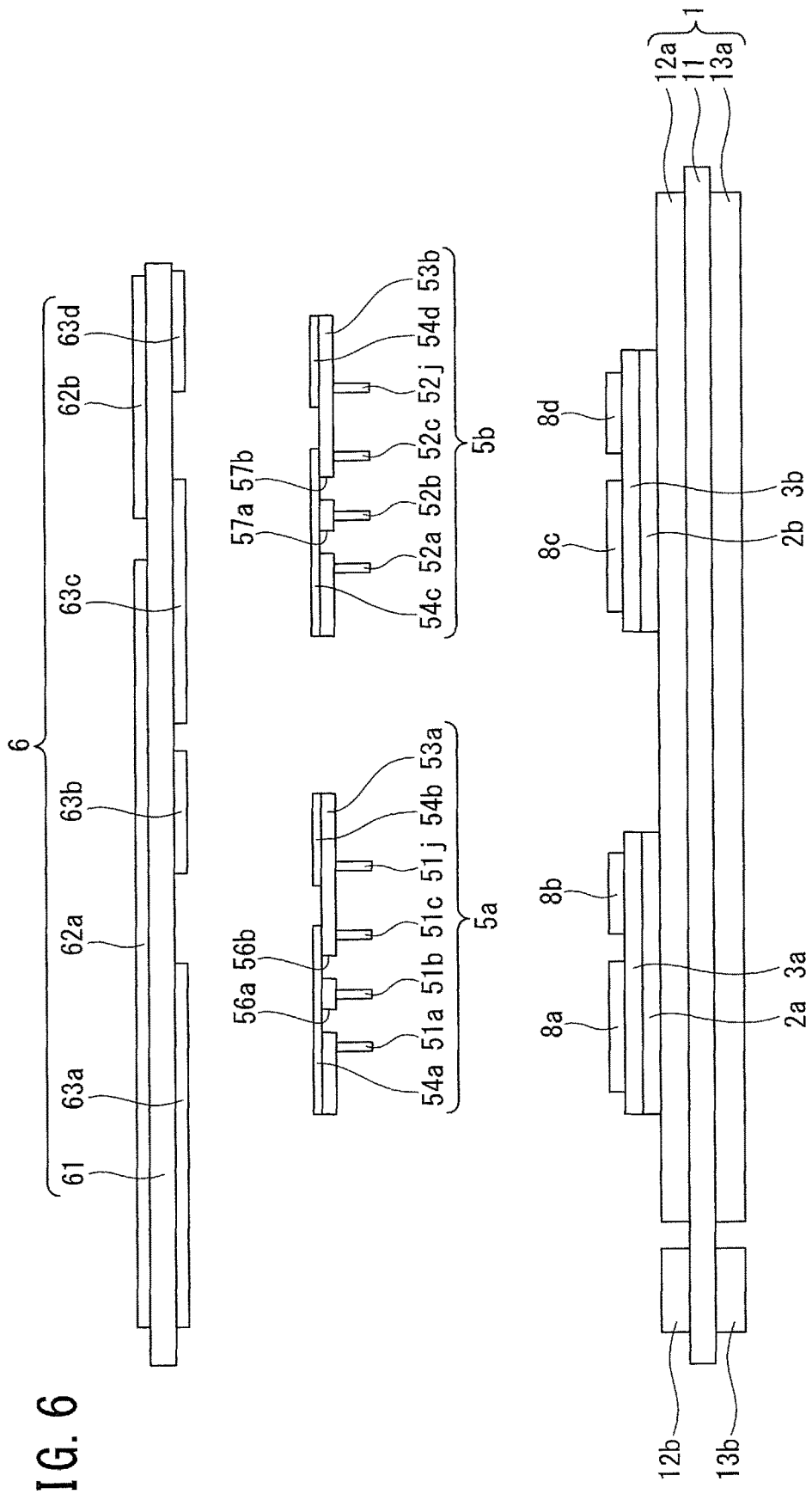
FIG. 6 is a side view for explaining a method of manufacturing the semiconductor device according to the first embodiment.

A method of manufacturing (assembling) the semiconductor device according to the first embodiment is described below with reference to FIG. 6. The insulated circuit substrate 1 is prepared first, and the respective semiconductor chips 3a and 3b are then deposited on the insulated circuit substrate 1 with the respective bonding layers 2a and 2b interposed. The solid-state solder layers 8a to 8d formed into a plate shape are further deposited on the semiconductor chips 3a and 3b.

The interposers 5a and 5b are also prepared so as to be deposited on the semiconductor chips 3a and 3b with the solder layers 8a to 8d interposed. A method of preparing the interposer 5a is as follows: the penetration holes 55a to 55j through which the post electrodes 51a to 51j penetrate and the penetration holes 55a to 56d filled with part of the solder layer 8a are formed in the insulating layer 53a in a film-like state by use of a metal die. A conductor foil is then attached to the insulating layer 53a, and is then delineated by etching or the like so as to form the conductor layers 54a and 54b. Alternatively, the conductor layers 54a and 54b may be preliminarily formed by etching or the like so as to be attached to the insulating layer 53a in the film-like state. The conductor layers 54a and 54b are then subjected to plating treatment, and the post electrodes 51a to 51j are inserted by pressure into the penetration holes 55a to 55j of the insulating layers 53a and 53b, so as to prepare the interposer 5a. The method of preparing the interposer 5b includes the same steps of preparing the interposer 5a described above.

The printed circuit board 6 is also prepared so as to be deposited on the respective interposers 5a and 5b with bonding layers (not illustrated) such as solder or sintered material interposed. Although not illustrated in FIG. 6, the source-side connection terminal 7a illustrated in FIG. 1 is inserted to the printed circuit board 6 so as to be deposited on the insulated circuit substrate 1 with bonding layers (not illustrated) such as solder or sintered material interposed. Similarly, the gate connection terminal 7b illustrated in FIG. 1 is deposited on the printed circuit board 6 with bonding layers (not illustrated) such as solder or sintered material interposed. Similarly, the drain-side connection terminal 7c illustrated in FIG. 1 is deposited on the insulated circuit substrate 1 with bonding layers (not illustrated) such as solder or sintered material interposed.

Next, a stacked body of the insulated circuit substrate 1, the semiconductor chips 3a and 3b, the interposers 5a and 5b, and the printed circuit board 6 is put into a heating furnace. The stacked body is then subjected to heating treatment in the heating furnace so that the insulated circuit substrate 1, the semiconductor chips 3a and 3b, the interposers 5a and 5b, the printed circuit board 6, the source-side connection terminal 7a, the gate connection terminal 7b, and the drain-side connection terminal 7c are bonded together. The solder layers 8a and 8c for bonding between the semiconductor chips 3a and 3b and the interposers 5a and 5b are melted during this heat treatment, and the melted solder layers 8a and 8c then creep upward along the post electrodes 51a to 51i and 52a and 52c and are drawn further toward the penetration holes 56a to 56d, 57a, and 57b provided in the insulating layers 53a and 53b of the interposers 5a and 5b due to the capillary phenomenon. The penetration holes 56a to 56d, 57a, and 57b are then filled with the drawn-up solder of the solder layers 8a and 8b, and the solder layers 8a and 8b are concentrated in the center of the post electrodes 51a to 51i and 52a to 52c, so as to avoid the spread over the surfaces of the semiconductor chips 3a and 3b.

Thereafter, the semiconductor chips 3a and 3b, the interposers 5a and 5b, and the printed circuit board 6 are sealed with the sealing member 9. The semiconductor device illustrated in FIG. 1 is thus completed.

Second Embodiment

Figure 7:
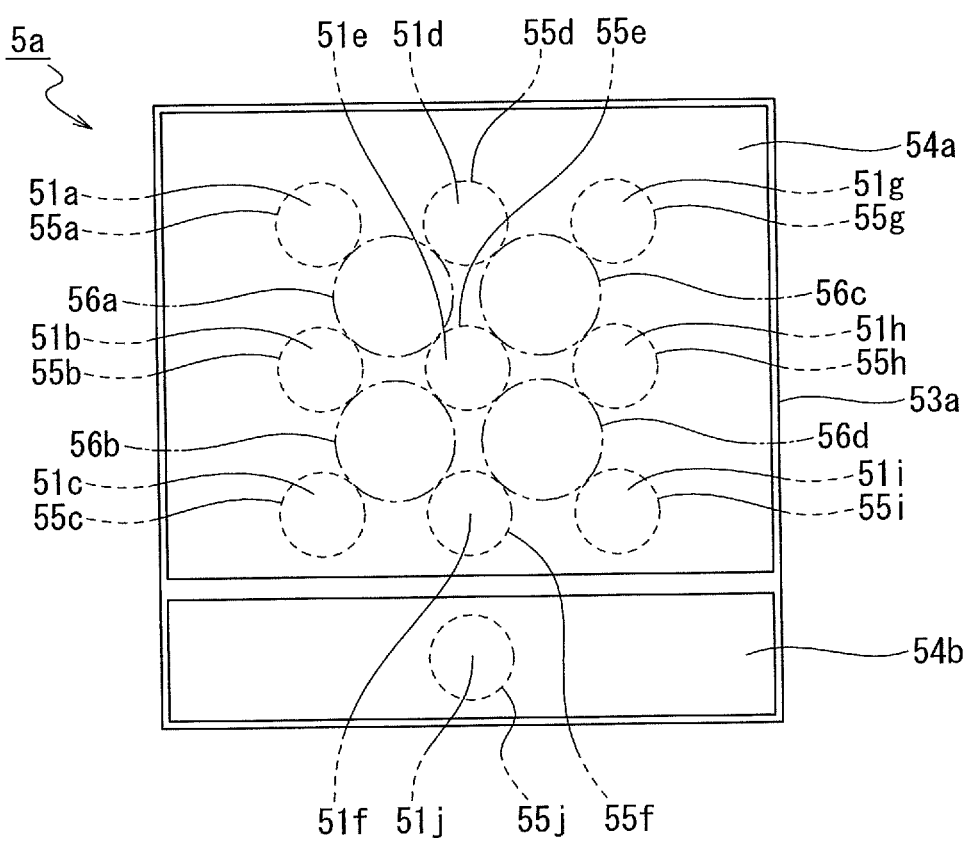
FIG. 7 is a plan view illustrating an interposer in a semiconductor device according to a second embodiment.

A semiconductor device according to a second embodiment differs from the semiconductor device according to the first embodiment in that the penetration holes 56a to 56d of the insulating layer 53a of the interposer 5a filled with part of the solder layer 8a have a greater size than the penetration holes 55a to 55i through which the post electrodes 51a to 51i penetrate, and the respective penetration holes 56a to 56d are in contact with the penetration holes 55a to 55i and the post electrodes 51a to 51i, as illustrated in FIG. 7.

The penetration hole 56a is in contact with the penetration holes 55a, 55b, 55d, and 55e and the post electrodes 51a, 51b, 51d, and 51e. The penetration hole 56b is in contact with the penetration holes 55b, 55c, 55e, and 55f and the post electrodes 51b, 51c, 51e, and 51f. The penetration hole 56c is in contact with the penetration holes 55d, 55e, 55g, and 55h and the post electrodes 51d, 51e, 51g, and 51h. The penetration hole 56d is in contact with the penetration holes 55e, 55f, 55h, and 55i and the post electrodes 51e, 51f, 51h, and 51i. The interposer 5b illustrated in FIG. 1 also has a configuration similar to that of the interposer 5a illustrated in FIG. 7. The other configurations of the semiconductor device according to the second embodiment are the same as those of the semiconductor device according to the first embodiment, and overlapping explanations are not repeated below.

The semiconductor device according to the second embodiment, in which the penetration holes 56a to 56d of the insulating layer 53a of the interposer 5a are in contact with the penetration holes 55a to 55i and the post electrodes 51a to 51i, can also lead the solder layer 8a to be drawn up through the penetration holes 56a to 56d due to the capillary phenomenon, so as to prevent a cause of gaps between the solder layer 8a and the insulating layer 53a and thus avoid the spread of the solder layer 8a. This configuration can improve the reliability and avoid or decrease the insulation failure of the semiconductor device according to the second embodiment if a change in temperature is caused.

Third Embodiment

Figure 8:
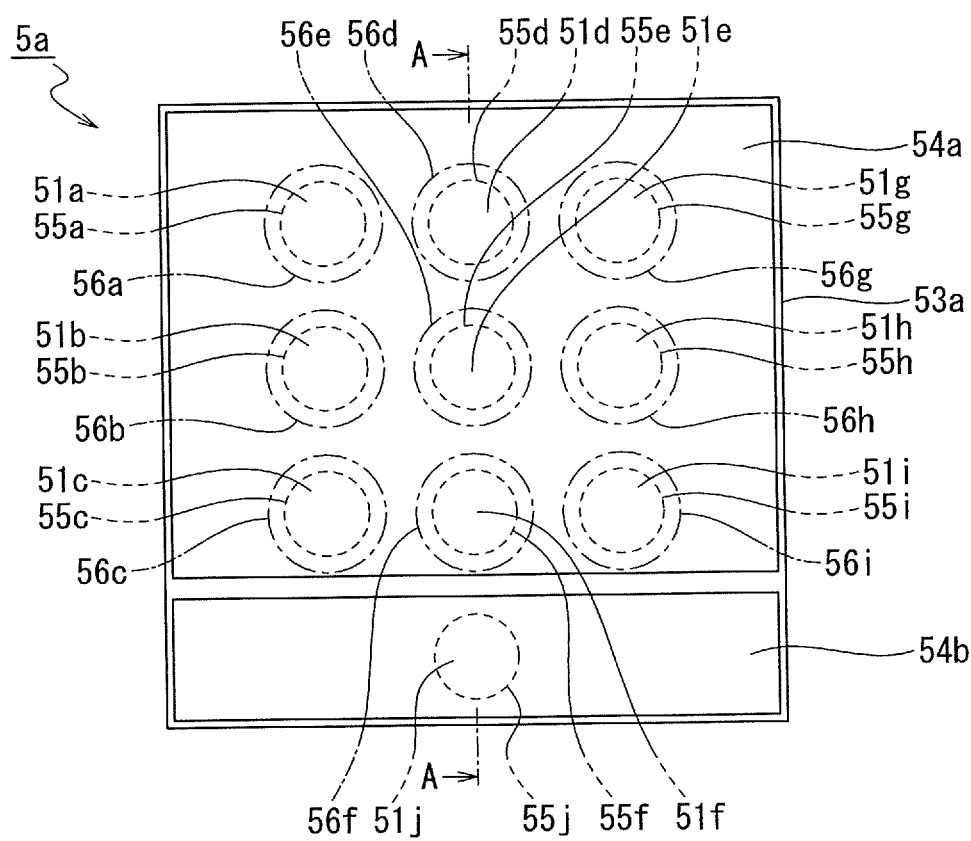
FIG. 8 is a plan view illustrating an interposer in a semiconductor device according to a third embodiment.
Figure 9:
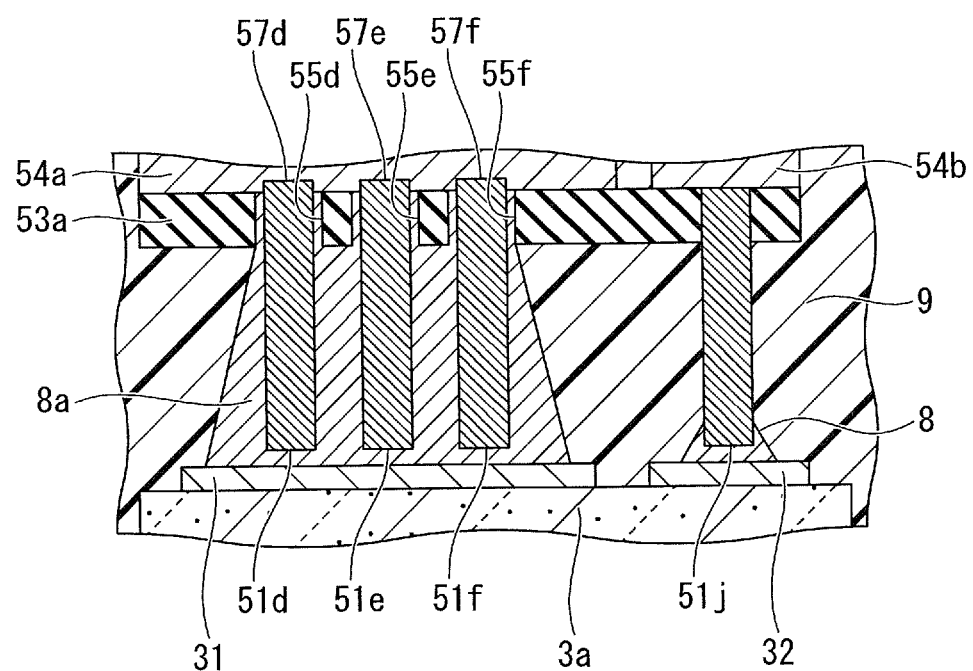
FIG. 9 is a cross-sectional view as viewed from direction A-A in FIG. 8.

FIG. 8 is a plan view illustrating an interposer 5a of a semiconductor device according to a third embodiment, and FIG. 9 is a cross-sectional view illustrating the circumferential elements of the interposer 5a taken along line A-A in FIG. 8. As illustrated in FIG. 8 and FIG. 9, the semiconductor device according to the third embodiment differs from the semiconductor device according to the first embodiment in that the post electrodes 51a to 51i penetrate through the penetration holes 56a to 56i provided in the insulating layer 53a of the interposer 5a, and the gaps between the post electrodes 51a to 51i and the penetration holes 56a to 56i are filled with part of the solder layer 8a.

The semiconductor device according to the third embodiment includes the penetration holes 56a to 56i through which the post electrodes 51a to 51i penetrate to protrude so as to lead the solder layer 8a to be drawn up due to the capillary phenomenon. The penetration holes 56a to 56i have a greater size than the post electrodes 51a to 51i, and are separated from the post electrodes 51a to 51i. The outer circumferential surfaces of the respective post electrodes 51a to 51i may be partly in contact with the respective penetration holes 56a to 56i.

As illustrated in FIG. 9, the conductor layer 54a is provided with recesses 57d to 57f corresponding to the post electrodes 51d to 51f. The post electrodes 51d to 51f are inserted by pressure into the recesses 57d to 57f. Although not illustrated, the conductor layer 54a is further provided with other recesses corresponding to the post electrodes 51a to 51c and 51g to 51i. The interposer 5b illustrated in FIG. 1 also has a configuration similar to that of the interposer 5a illustrated in FIG. 8 and FIG. 9. The other configurations of the semiconductor device according to the third embodiment are the same as those of the semiconductor device according to the first embodiment, and overlapping explanations are not repeated below.

The semiconductor device according to the third embodiment, in which the gaps between the penetration holes 56a to 56i and the post electrodes 51a to 51i lead the solder layer 8a to be drawn up due to the capillary phenomenon, can prevent a cause of gaps between the solder layer 8a and the insulating layer 53a and thus avoid the expansion of the spread of the solder layer 8a. This configuration can improve the reliability and avoid or decrease the insulation failure of the semiconductor device according to the third embodiment if a change in temperature is caused.

In addition, the semiconductor device according to the third embodiment with the configuration described above can decrease the areas of the penetration holes 56a to 56i of the insulating layer 53a, as compared with a case in which the penetration holes through which the post electrodes 51a to 51i penetrate are provided separately from the penetration holes filled with part of the solder layer 8a, so as to improve the rigidity of the insulating layer 53a.

Fourth Embodiment

Figure 10:
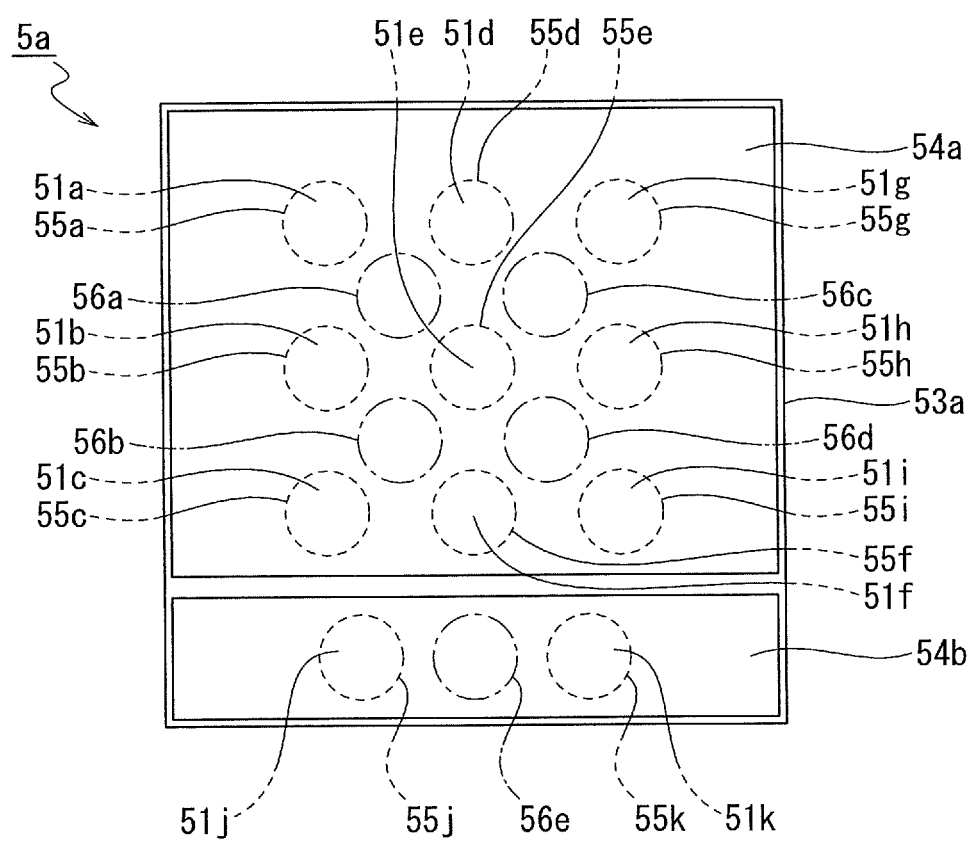
FIG. 10 is a plan view illustrating an interposer in a semiconductor device according to a fourth embodiment.

A semiconductor device according to a fourth embodiment differs from the semiconductor device according to the first embodiment in that two post electrodes 51j and 51k for gates penetrate through the insulating layer 53b of the interposer 5a, and a penetration hole 56e filled with part of the solder layer 8b is provided between the two post electrodes 51j and 51k, as illustrated in FIG. 10.

The insulating layer 53b is provided with the penetration hole 56e that leads the solder layer 8b to be drawn up between the respective penetration holes 55j and 55k, in addition to penetration holes 55j and 55k through which the two post electrodes 51j and 51k penetrate. The interposer 5b illustrated in FIG. 1 also has a configuration similar to that of the interposer 5a illustrated in FIG. 10. The other configurations of the semiconductor device according to the fourth embodiment are the same as those of the semiconductor device according to the first embodiment, and overlapping explanations are not repeated below.

The semiconductor device according to the fourth embodiment with the configuration regarding the insulating layer 53a for source can lead the solder layer 8a to be drawn up through the penetration holes 56a to 56d due to the capillary phenomenon, so as to prevent a cause of gaps between the solder layer 8a and the insulating layer 53a and thus avoid the expansion of the spread of the solder layer 8a. The configuration regarding the insulating layer 53b for gate, which is provided with the penetration hole 5e between the respective post electrodes 51j and 51k, can lead the solder layer 8b to be drawn up through the penetration hole 56e due to the capillary phenomenon, so as to prevent a cause of gaps between the solder layer 8b and the insulating layer 53b and thus avoid the expansion of the spread of the solder layer 8b. This configuration can improve the reliability and avoid or decrease the insulation failure of the semiconductor device according to the fourth embodiment if a change in temperature is caused.

Fifth Embodiment

Figure 11:
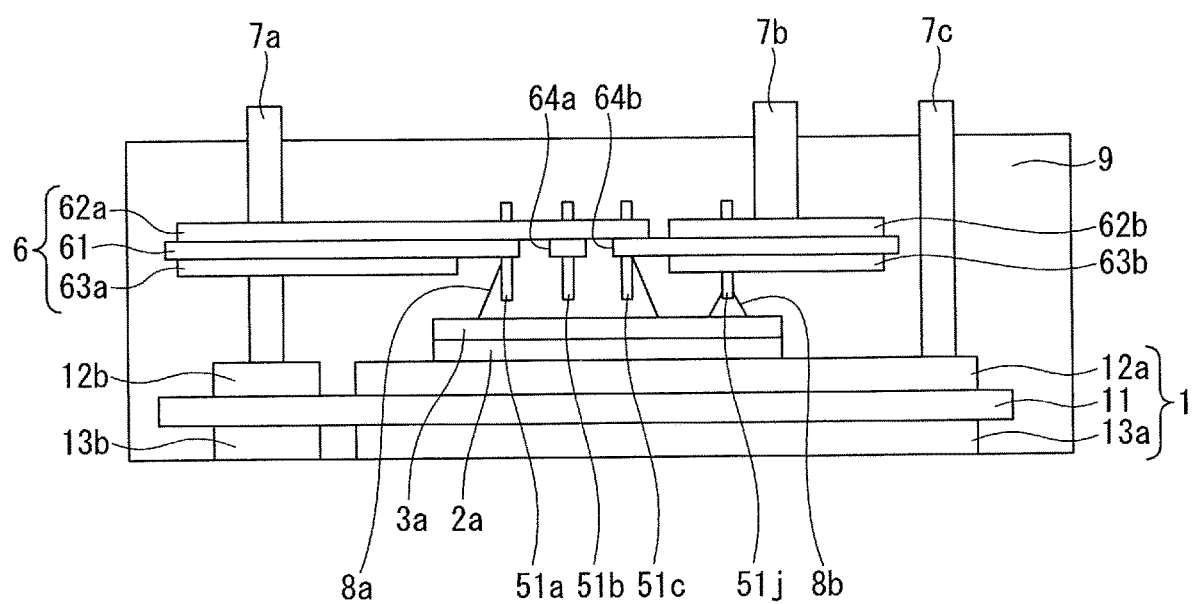
FIG. 11 is a side view illustrating a semiconductor device according to a fifth embodiment.

A semiconductor device according to a fifth embodiment differs from the semiconductor device according to the first embodiment in including the single semiconductor chip 3a with no interposers provided between the semiconductor chip 3a and the printed circuit board 6, as illustrated in FIG. 11.

The conductive connection between the semiconductor chip 3a and the printed circuit board 6 is ensured through the post electrodes 51a to 51c and 51j. The printed circuit board 6 includes the insulating layer 61, the conductor layers (the upper conductor layers) 62a and 62b deposited on the top surface of the insulating layer 61, and the conductor layers (the lower conductor layers) 63a and 63b deposited on the bottom surface side of the insulating layer 61.

The post electrodes 51a to 51c for source, among the post electrodes 51a to 51c and 51j, penetrate through the insulating layer 61 and the upper conductor layer 62a so as to be electrically connected to the upper conductor layer 62a. The post electrode 51j for gate penetrates through the insulating layer 61, the upper conductor layer 62b, and the lower conductor layer 63b so as to be electrically connected to the upper conductor layer 62b and the lower conductor layer 63b.

The insulating layer 61 of the printed circuit board 6 is provided with penetration holes (not illustrated) through which the post electrodes 51a to 51c and 51j penetrate, and penetration holes 64a and 64b filled with part of the solder layer 8a. The penetration holes 64a and 64b are located at positions separated from the penetration holes (not illustrated) through which the post electrodes 51a to 51c and 51j penetrate at the equal distances. The other configurations of the semiconductor device according to the fifth embodiment are the same as those of the semiconductor device according to the first embodiment, and overlapping explanations are not repeated below.

The semiconductor device according to the fifth embodiment with the configuration as described above can lead the solder layer 8a to be drawn up through the penetration holes 64a and 64b provided in the insulating layer 61 of the printed circuit board 6 due to the capillary phenomenon, so as to prevent a cause of gaps between the solder layer 8a and the insulating layer 61 and thus avoid the expansion of the spread of the solder layer 8a. This configuration can improve the reliability and avoid or decrease the insulation failure of the semiconductor device according to the fifth embodiment if a change in temperature is caused.

The respective penetration holes 64a and 64b provided in the insulating layer 61 may be in contact with the penetration holes (not illustrated) through which the post electrodes 51a to 51c penetrate. Alternatively, the respective post electrodes 51a to 51c may penetrate through the respective penetration holes 64a and 64b so that the gaps between the respective post electrodes 51a to 51c and the respective penetration holes 64a and 64b are filled with part of the solder layer 8a. In such a case, the upper conductor layer 62a may be provided with a plurality of recesses to which the other ends of the respective post electrodes 51a to 51c are inserted by pressure.

Other Embodiments

As described above, the invention has been described according to the first to fifth embodiments, but it should not be understood that the description and drawings implementing a portion of this disclosure limit the invention. Various alternative embodiments of the present invention, examples, and operational techniques will be apparent to those skilled in the art from this disclosure.

While the respective first to fifth embodiments have been illustrated above with the semiconductor device that is the "1-in-1" power semiconductor module having the functions for a single semiconductor element, the present invention is not limited to this case. For example, the present invention may also be applied to a "2-in-1" power semiconductor module having functions for two semiconductor elements.

The configurations disclosed in the first to fifth embodiments may be combined as appropriate within a range that does not contradict with the scope of the respective embodiments. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

The invention claimed is:

1. A semiconductor device comprising:
    an insulated circuit substrate;
    a semiconductor chip deposited on one of main surfaces of the insulated circuit substrate;
    a printed circuit board provided to be opposed to the one of the main surfaces of the insulated circuit substrate;
    an interposer provided between the semiconductor chip and the printed circuit board; and
    a sealing member provided to seal the semiconductor chip, the interposer, and the printed circuit board,
    the interposer including
        a plurality of post electrodes each having one end bonded to the semiconductor chip via a solder layer,
        an insulating layer provided to be separately opposed to the semiconductor chip and provided with a first penetration hole filled with part of the solder layer, and
        a conductor layer provided to be opposed to the printed circuit board and connected to another end of each of the post electrodes via the insulating layer.

2. A semiconductor device comprising:
    an insulated circuit substrate;
    a semiconductor chip deposited on one of main surfaces of the insulated circuit substrate;
    a plurality of post electrodes each having one end bonded to the semiconductor chip via a solder layer;
    a printed circuit board provided to be opposed to the one of the main surfaces of the insulated circuit substrate; and
    a sealing member provided to seal the semiconductor chip and the printed circuit board,
    the printed circuit board including
        an insulating layer provided to be separately opposed to the semiconductor chip and provided with a first penetration hole filled with part of the solder layer, and a conductor layer connected to another end of each of the post electrodes via the insulating layer.

3. The semiconductor device of claim 1, wherein the insulating layer is further provided with a plurality of second penetration holes through which the plural post electrodes penetrate.

4. The semiconductor device of claim 3, wherein the first penetration hole is provided separately from the respective adjacent second penetration holes at equal distances.

5. The semiconductor device of claim 3, wherein the first penetration hole is in contact with the respective second penetration holes.

6. The semiconductor device of claim 1, wherein:
the insulating layer comprises a plurality of the first penetration holes;
the plural post electrodes penetrate through the first penetration holes; and
a gap between the respective post electrodes and the respective first penetration holes is filled with part of the solder layer.

7. The semiconductor device of claim 6, wherein the conductor layer is provided with a plurality of recesses to which the other end of each of the post electrodes is inserted by pressure.

8. The semiconductor device of claim 2, wherein the insulating layer is further provided with a plurality of second penetration holes through which the plural post electrodes penetrate.

9. The semiconductor device of claim 8, wherein the first penetration hole is provided separately from the respective adjacent second penetration holes at equal distances.

10. The semiconductor device of claim 8, wherein the first penetration hole is in contact with the respective second penetration holes.

11. The semiconductor device of claim 2, wherein:
the insulating layer comprises a plurality of the first penetration holes;
the plural post electrodes penetrate through the first penetration holes; and
a gap between the respective post electrodes and the respective first penetration holes is filled with part of the solder layer.

12. The semiconductor device of claim 11, wherein the conductor layer is provided with a plurality of recesses to which the other end of each of the post electrodes is inserted by pressure.

* * * * *